United States Patent [19]
Baum et al.

[11] Patent Number: 5,233,633
[45] Date of Patent: Aug. 3, 1993

[54] AUTOMATIC FREQUENCY CONTROL BY AN ADAPTIVE FILTER

[75] Inventors: Kevin L. Baum, Hoffman Estates; Bruce D. Mueller, Palatine, both of Ill.

[73] Assignee: Motorola, Inc., Schaumburg, Ill.

[21] Appl. No.: 15,666

[22] Filed: Feb. 9, 1993

Related U.S. Application Data
[63] Continuation of Ser. No. 722,828, Jun. 28, 1991, abandoned.

[51] Int. Cl.[5] .............................................. H04L 27/06
[52] U.S. Cl. ...................................... 375/97; 375/14; 331/1 H; 455/164.1; 455/192.2
[58] Field of Search ..................................... 375/14–15, 375/93–94, 96–97; 331/1 R, 1 H; 358/195.1; 455/75, 164.1, 164.2, 173.1, 192.2, 257

[56] References Cited

U.S. PATENT DOCUMENTS

| | | | |
|---|---|---|---|
| 4,466,108 | 8/1984 | Rhodes | 375/97 |
| 4,829,543 | 5/1989 | Borth et al. | 375/96 |
| 4,835,790 | 5/1989 | Yoshida et al. | 375/97 |
| 4,852,090 | 7/1989 | Borth | 375/14 |
| 4,896,336 | 1/1990 | Henely et al. | 375/97 |

*Primary Examiner*—Curtis Kuntz
*Assistant Examiner*—Young Te
*Attorney, Agent, or Firm*—Kenneth W. Bolvin

[57] ABSTRACT

The process of the present invention generates an optimum automatic frequency control signal in an apparatus that has a plurality of adaptive algorithms, each adaptive algorithm having a reference signal with an associated frequency dither. The process starts by comparing the performance of each of the plurality of adaptive algorithms. This difference is input to a comparator where it is compared to zero. This delta signal then modifies the numerically controlled oscillator frequency. After several iterations, the frequency offset is reduced to substantially zero.

6 Claims, 4 Drawing Sheets

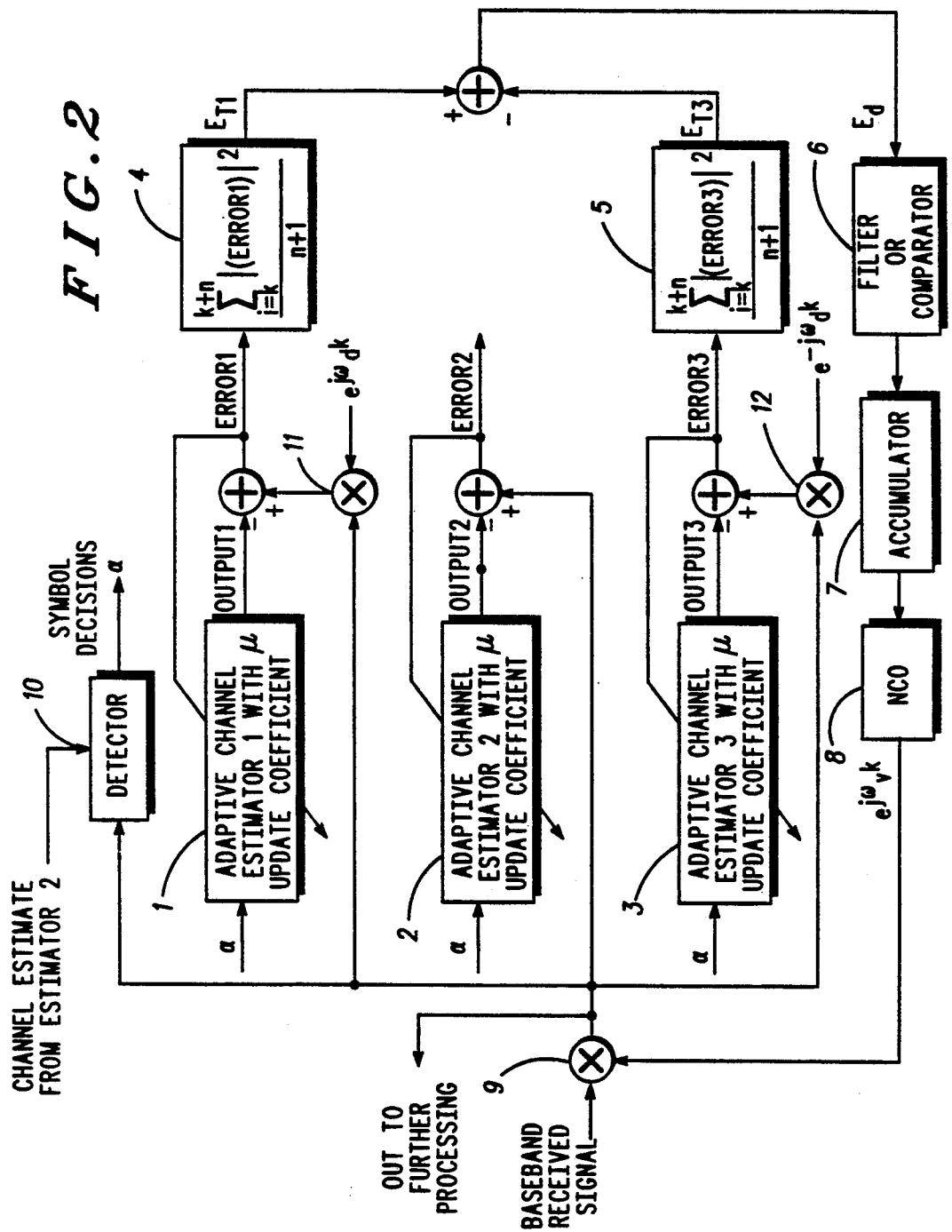

AUTOMATIC FREQUENCY CONTROL BY AN ADAPTIVE FILTER

This is a continuation of U.S. application Ser. No. 07/722,828, filed Jun. 28, 1991 and now abandoned.

FIELD OF THE INVENTION

The present invention relates generally to the field of communications and particularly to automatic frequency control.

BACKGROUND OF THE INVENTION

U.S. digital cellular (USDC) communications uses digitized voice and data signals for communication between a mobile telephone and a base station. The mobiles and bases employ time division multiple access (TDMA) modulation for the transmission of these signals. A typical format for the TDMA data bursts is illustrated in FIG. 5. This data burst, as well as USDC in general, is discussed in more detail in the USDC specification EIA/TIA IS-54 available from Electronic Industries Association, Engineering Department, 2001 Eye Street, N.W., Washington, D.C. 20006.

When the mobile moves, it may encounter degraded communication channels due to noise and multipath distortion; both noise and distortion varying with time. The multipath distortion is due to a signal being received by the mobile at different times when it bounces off buildings and terrain. Multipath channels can cause inter-symbol interference (ISI) that can be removed with an adaptive channel equalizer, a specific type of adaptive filter. An adaptive channel estimator is another type of adaptive filter.

A typical adaptive filter is illustrated in FIG. 1. The input signal (106) is processed by the adaptive filter (101), producing the adaptive filter output signal (102). The output of the filter is then subtracted (105) from a reference signal (103), typically the unfiltered input signal (106), to produce an error signal (104). This error signal (104) is used by an adaptive algorithm with an update coefficient, $\mu$, in the adaptive filter to update the filter coefficients. The update coefficient is also referred to as a tracking coefficient or memory coefficient. The memory of the adaptive algorithm increases as the value of $\mu$ increases.

The adaptive algorithm may be a Kalman, Recursive Least Square, or Least Mean Square (LMS) algorithm. The typical goal of the adaptive algorithm is to minimize the mean square value of the error signal (104), fixed update coefficient. This value is typically designated mean square error (MSE).

A detrimental characteristic of adaptive channel equalizers is that they can experience degraded performance in the presence of a frequency offset of more than approximately 10 Hz (in a system with a 24 kHz symbol rate). While the specification for a transmission system requires a certain frequency variation limit, the adaptive channel equalizer may require a stricter limit. An example is the USDC system. USDC requires the receiver operating frequency to be locked within 200 Hz of the transmitter. The adaptive channel equalizer will not perform properly in this environment. A coarse automatic frequency control (AFC) is typically used to remove most of the offset. Any remaining offset, however, can detrimentally affect a detection algorithm and increase the detected bit error rate. There is a resulting need for an AFC that can reduce the frequency offset to an acceptably small level and track any variation of the offset as the environment changes when the mobile moves.

SUMMARY OF THE INVENTION

The process of the present invention generates an optimum automatic frequency control signal in an apparatus that has a plurality of adaptive algorithms, each adaptive algorithm having a reference signal with an associated frequency dither. The process starts by comparing the performance of each of the plurality of adaptive algorithms then modifying the automatic frequency control signal in response to a difference in the performances.

BRIEF DESCRIPTION OF THE DRAWINGS

FIG. 2 shows a block diagram of the process of the present invention.

DETAILED DESCRIPTION OF THE PREFERRED EMBODIMENT

The process of the present invention provides fine automatic frequency control in a device using adaptive filters. The difference in performance of the adaptive filters is used to modify the AFC signal, thereby reducing the frequency offset.

A linear coherent digital radio receiver typically demodulates the incoming signal by mixing the signal to baseband using a local oscillator. The frequency of the local oscillator must be kept reasonably close to the frequency of the transmitter. After the signal has been mixed down to baseband, further analog or digital signal processing is performed to recover an estimate of the transmitted data. In the following description of the process of the present invention, it is assumed that the baseband signal has been converted by an analog to digital converter to a form suitable for further digital signal processing.

The preferred embodiment of the process of the present invention, as illustrated in FIG. 2, is comprised of three adaptive filters (1-3) configured as adaptive channel estimators (ACE). The three ACE's (1-3) have an update coefficient, $\mu$, that varies with the environment of the device. The process for determining $\mu$ is described in co-pending application titled "A Method for Optimization of Adaptive Filter Update Coefficient" U.S. Ser. No. 07/722,825 filed on Jun. 28, 1991 to Kevin Baum and assigned to Motorola, Inc. The update coefficient will remain constant during a single TDMA data burst.

The three ACE's (1-3) are identical except for having different frequency offset dither generators, a dither generator being the source of the reference signal. ACE 2 uses the baseband received signal that has been mixed (9) with the numerically controlled oscillator (NCO) (8) signal as the reference signal. ACE's 1 and 3 mix (11 and 12) this reference signal with frequency offsets before using it as a reference signal.

Figure 1:
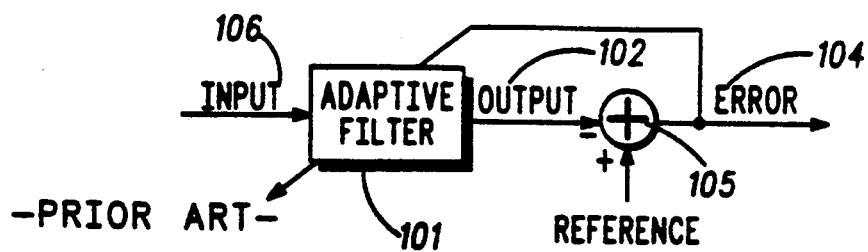
FIG. 1 shows a block diagram of a typical adaptive filter.
Figure 3:
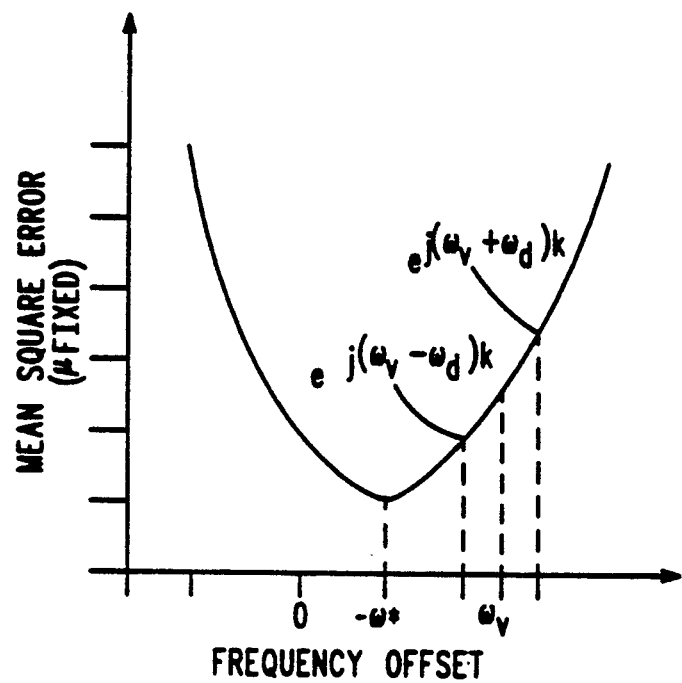
FIG. 3 shows a graph of mean square error versus residual frequency offset in accordance with the process of the present invention.
Figure 5:
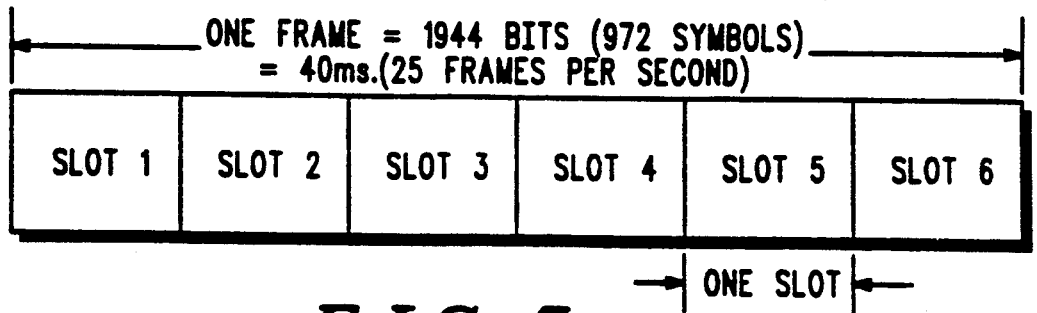
FIG. 5 shows the format of a TDMA data burst used in the U.S. digital cellular communication system.

The frequency offsets, $e^{j\omega_d k}$ and $e^{-j\omega_d k}$, and their relationship to the desired residual frequency offset, $\omega^*$, are illustrated graphically in FIG. 3. These offsets are located on either side of the frequency offset estimate, $-\omega_v$. ACE's 1 and 3 act as residual frequency offset "probes"; relative to ACE 2, ACE 1 acts as a "high" frequency probe and ACE 3 acts as a "low" frequency probe. ACE's 1 and 3 estimate two points on the MSE curve. ACE 2 performs the actual desired adaptive filtering function.

The k term of the frequency offset denotes the time index of the sample. The $\omega_d$ term is application dependent. $\omega_d$ should be chosen as small as possible while still allowing a difference in the mean square errors (MSE) to be detected. $\omega_d$ could also vary with time by setting it to a larger value initially to speed acquisition and then reduced to get the most accurate frequency offset estimate. In the preferred embodiment, $\omega_d$ is set to a value of $5 \times (2\pi)$ radians/second.

In operation, the process of the present invention initially removes the current estimated frequency offset, $-\omega_v$, from the baseband received signal by mixing (9) the signal with the NCO (8) output, $e^{j\omega_v k}$. Initially, the NCO (8) frequency, $\omega_v$, is set to zero if there is no prior knowledge of the initial frequency offset. This is indicated by the initial accumulator (7) value being zero.

This signal is then operated on by a detection algorithm (10) that is driven by the ACE 2 output. The resulting symbol decision signal, $\alpha$, is input to the three ACE's (1-3).

The ACE's (1-3) generate error signals that are the difference between the filtered output and the associated reference signals that are discussed above. Two of the error signals, error1 and error3, are input to MSE estimators (4 and 5) that operate as follows:

$$E_{T1} = \frac{\sum_{i=k}^{k+n} |error1|^2}{n+1}$$

$$E_{T3} = \frac{\sum_{i=k}^{k+n} |error3|^2}{n+1}$$

where k is the same as in the frequency offset and n is the number of samples of the error signal. As an example, if k=1 and n=10 for the first estimation cycle, k will start at 12 for the next cycle.

The difference between the estimated MSE's, $E_d = E_{T1} - E_{T3}$, provides an indication of which direction to move along the frequency offset axis, illustrated in FIG. 3, to get closer to the minimum MSE point (residual offset=0). For example, if the residual frequency offset is greater than 0, $E_{T1}$ will be larger than $E_{T3}$ thus making $E_d < 0$. The negative value of $E_d$ indicates that $\omega_v$ is too large and should be decremented.

In the preferred embodiment, $E_d$ is input to a comparator (6) where it is compared to 0. In this case, the comparator has an output function, $f(E_d)$, as follows:

$f(E_d) = \Delta$ when $E_d > 0$, $f(E_d) = -\Delta$ when $E_d < 0$, $f(E_d) = 0$ when $E_d = 0$, where $\Delta$ is application dependent and determines the resolution of the AFC and also the adaptation speed of the AFC. $\Delta$ can be chosen as a very small value for a system with a coarse AFC. In an alternate embodiment, $\Delta$ could vary with time by setting it to a larger value initially to speed acquisition and then reduced to get the most accurate frequency offset estimate. In the preferred embodiment, $\Delta$ is set to a value of $2\pi$ radians/second.

In an alternate embodiment, $E_d$ is input to a filter instead of a comparator. The filter provides a time varying step size (compared to the fixed step size of $\Delta$) that is responsive to the size of the error difference signal. For example, when the error difference signal becomes large, the step size automatically increases resulting in faster convergence of the algorithm. Using the filter, however, increases the complexity of the invention and may cause stability problems if a higher order filter is used. A first order digital infinite impulse response (IIR) filter is preferred due to stability and simplicity considerations. The output of the filter is used to update the frequency offset estimate.

The output of the comparator (6) (or filter) is input to an accumulator (7) that adds the new input value to the previously stored value. The accumulated value is then used to control the frequency, $\omega_v$, of the NCO (8). Since the MSE's $E_{T1}$ and $E_{T3}$ are estimated over blocks of n samples, $E_d$ and the outputs of the comparator (7) and accumulator (8) are calculated every n iterations. The NCO (8) frequency, therefore, is updated once every n iterations.

As illustrated graphically in FIG. 3, after several NCO (8) update cycles, $\omega_v$ will be approximately equal to $-\omega^*$ and the residual frequency offset will be approximately zero. If the frequency offset changes, the process of the present invention detects and tracks the change.

Figure 4:
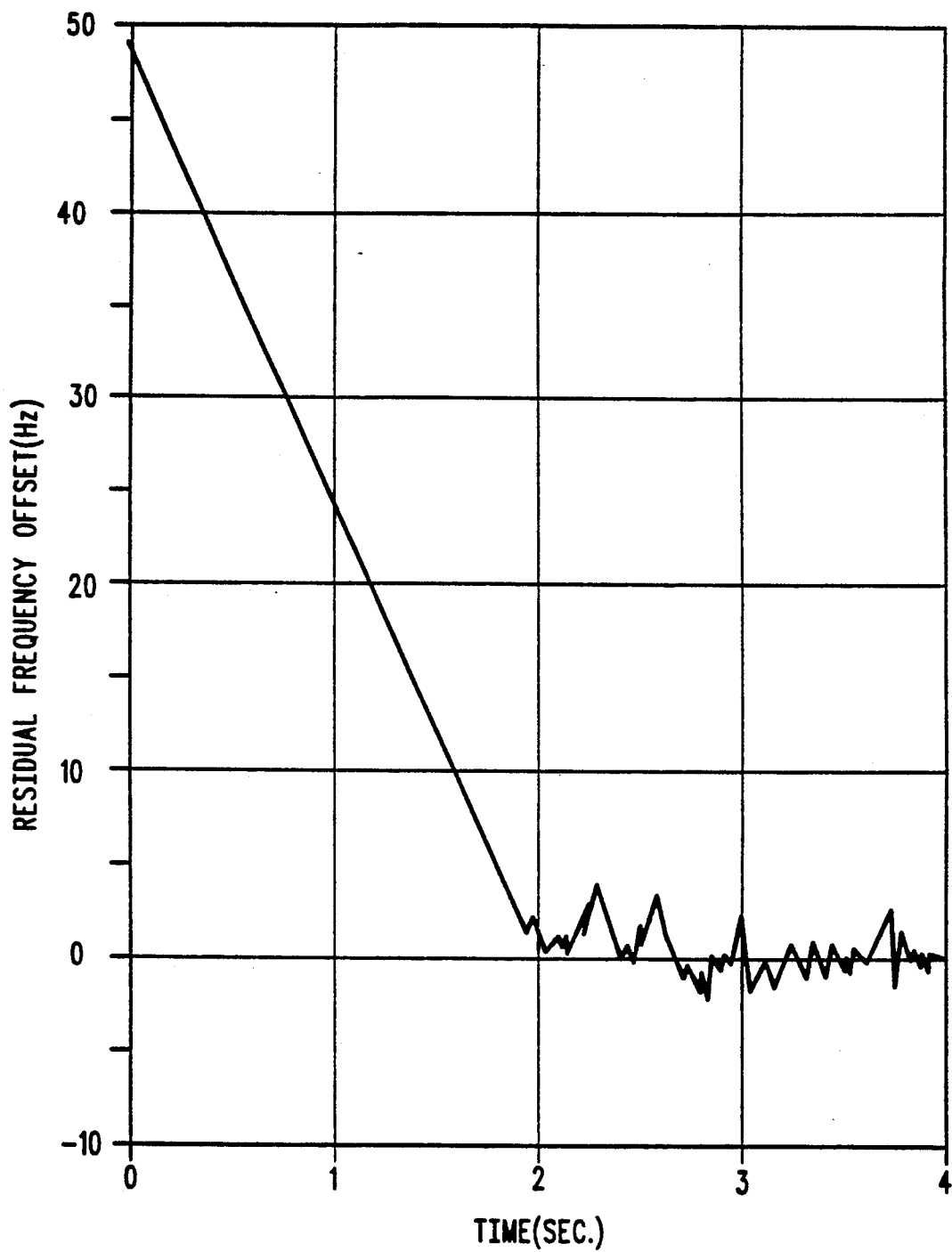
FIG. 4 shows a graph of residual frequency offset versus time in accordance with the process of the present invention.

The operation of the process of the present invention can be seen in graphically FIG. 4. The process is using an LMS adaptive channel estimator with an initial frequency offset of 50 Hz. The bit error rate of the detector in this example is 1%. Note that the residual frequency offset quickly declines to nearly 0 Hz. The slope of the initial change from 50 Hz can be changed by modifying $\Delta$. A larger value for $\Delta$ will cause a faster acquisition and, therefore, a steeper slope.

In the preferred embodiment, the process of the present invention is implemented as an algorithm. Alternate embodiments of the invention can be implemented in hardware or combinations of hardware and software; each block of the process being either an algorithm or a hardware circuit equivalent of that block.

Another alternate embodiment can use only two adaptive filters by not using the second adaptive filter. In this embodiment, the output of one of the filters replaces the second filter's output. The resulting AFC value will be biased by $\Delta/2$.

Figure 6:
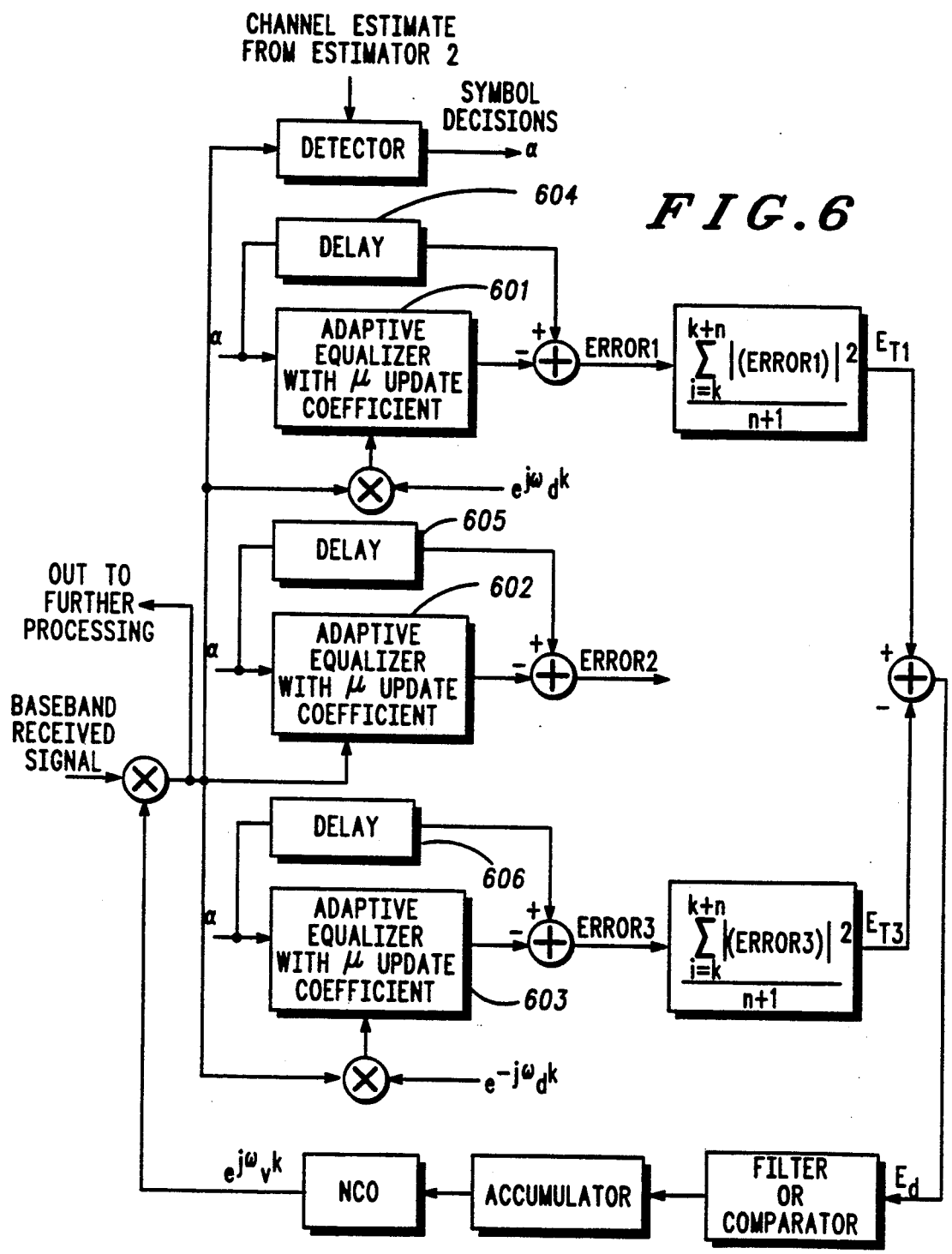
FIG. 6 shows an alternate embodiment of the process of the present invention.

Still another alternate embodiment, illustrated in FIG. 6, can use adaptive equalizers in place of the channel estimators. In this embodiment, the reference signal and the symbol decision signal, $\alpha$, are input to the equalizer. The adaptive equalizers (601-603) are operative to remove the ISI from the respective dithered received signals. The adaptive equalizer may have some inherent delay until an output responsive to the current input is available. The symbol decisions, $\alpha$, are delayed (604-606) until equalizer output corresponding to that decision is available. The difference between the symbol decisions and the corresponding equalizer output forms an error signal. The error signal is used in the same way as the preferred embodiment to update the NCO frequency.

In summary, a process of automatic frequency control in a changing environment has been described. By comparing the performance of each adaptive algorithm to determine how to change the oscillator frequency, the frequency offset can be reduced to almost zero. The process of the present invention is not affected by intersymbol interference since the adaptive channel equalizers take the ISI into account in their estimates. Communication devices using the process of the present invention can out-perform devices using only coarse AFC.

We claim:

1. A method for generating an automatic frequency control signal in an apparatus having a plurality of adaptive filters, each adaptive filter having an adaptive algorithm, a subset number of adapter filters of the plurality of adaptive filters having a reference signal with an associated frequency dither, the method comprising the steps of:
   generating a difference signal by comparing performances of the subset number of adaptive filters with each other; and
   adjusting the automatic frequency control signal in response to the difference signal.

2. A method for automatic frequency control in a system having a baseband received signal, an oscillator signal, and a symbol decision signal, the method comprising the steps of:
   multiplying the baseband received signal with the oscillator signal to produce a first reference signal;
   multiplying the first reference signal by a first offset signal, having a first magnitude, to produce a second reference signal;
   multiplying the first reference signal by a second offset signal, having a second magnitude, to produce a third reference signal;
   generating a first error signal in response to the symbol decision signal and the first reference signal;
   generating a second error signal in response to the symbol decision signal and the second reference signal;
   generating a third error signal in response to the symbol decision signal and the third reference signal;
   estimating a first mean square error in response to the second error signal;
   estimating a second mean square error in response to the third error signal;
   subtracting the second mean square error from the first mean square error to produce a mean square error difference; and
   modifying the oscillator signal in response to the mean square error difference.

3. An apparatus for automatic frequency control in a device having a received signal, oscillating means for generating an oscillator signal, symbol detection means for generating a symbol decision signal, and a plurality of multiplying means for generating a plurality of reference signals, the apparatus comprising:
   first adaptive filtering means, coupled to the symbol detection means and first multiplying means of the plurality of multiplying means, for generating a first error signal in response to the symbol decision signal and a first reference signal of the plurality of reference signals;
   second adaptive filtering means, coupled to the symbol detection means and second multiplying means of the plurality of multiplying means, for generating a second error signal in response to the symbol decision signal, the oscillator signal, and the received signal;
   third adaptive filtering means, coupled to the symbol detection means and third multiplying means of the plurality of multiplying means, for generating a third error signal in response to the symbol decision signal and a second reference signal of the plurality of reference signals;
   first means for estimating mean square error, coupled to the first adaptive filtering means, for generating a first mean square error estimate;
   second means for estimating mean square error, coupled to the third adaptive filtering means, for generating a second mean square error estimate;
   summing means, coupled to the first and second means for estimating mean square error, for producing a difference signal;
   means for producing a delta signal coupled to the summing means; and
   accumulation means, coupled to the means for producing a delta signal and the oscillating means, for accumulating the delta signal.

4. The apparatus of claim 3 wherein the first, second, and third adaptive filtering means are adaptive channel estimators.

5. The apparatus of claim 3 wherein the first, second, and third adaptive filtering means are adaptive equalizers.

6. A method for automatic frequency control in a system having a baseband received signal, an oscillator signal, and a symbol decision signal, the method comprising the steps of:
   multiplying the baseband received signal with the oscillator signal to produce a first reference signal;
   multiplying the first reference signal by a first offset signal, having a first magnitude, to produce a second reference signal;
   multiplying the first reference signal by a second offset signal, having a second magnitude, to produce a third reference signal;
   generating a first error signal in response to the symbol decision signal and the second reference signal;
   generating a second error signal in response to the symbol decision signal and the third reference signal;
   estimating a first mean square error in response to the first error signal;
   estimating a second mean square error in response to the second error signal;
   subtracting the second mean square error from the first mean square error to produce a means square error difference; and
   modifying the oscillator signal in response to the mean square error difference.

* * * * *